United States Patent
Lee et al.

(10) Patent No.: US 11,947,238 B2
(45) Date of Patent: Apr. 2, 2024

(54) MULTILAYER THIN-FILM STRUCTURE AND PHASE SHIFTING DEVICE USING THE SAME

(71) Applicant: SAMSUNG ELECTRONICS CO., LTD., Suwon-si (KR)

(72) Inventors: Jeongyub Lee, Yongin-si (KR); Yongsung Kim, Suwon-si (KR); Jaekwan Kim, Hwaseong-si (KR); Changseung Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 157 days.

(21) Appl. No.: 17/469,189

(22) Filed: Sep. 8, 2021

(65) Prior Publication Data
US 2021/0405498 A1 Dec. 30, 2021

Related U.S. Application Data

(63) Continuation of application No. 16/406,677, filed on May 8, 2019, now Pat. No. 11,137,661.

(30) Foreign Application Priority Data

Sep. 21, 2018 (KR) .................. 10-2018-0114373

(51) Int. Cl.
*G02F 1/21* (2006.01)

(52) U.S. Cl.
CPC .................................. *G02F 1/218* (2013.01)

(58) Field of Classification Search
CPC ... B32B 27/08; B32B 27/36; B32B 2307/538;
B32B 27/308; B32B 2457/20; B32B 2270/00; B32B 27/18; B32B 27/32; B32B 15/08; B32B 15/18; B32B 15/20; B32B 2250/24; B32B 2262/0253;
(Continued)

(56) References Cited

U.S. PATENT DOCUMENTS

| 4,940,636 A | 7/1990 | Brock et al. |
| 7,018,750 B2 | 3/2006 | Hwang |

(Continued)

FOREIGN PATENT DOCUMENTS

| JP | 3329070 B2 | 9/2002 |
| JP | 2005-026567 A | 1/2005 |

(Continued)

OTHER PUBLICATIONS

Alexander Tikhonravov, et al., "Development of the needle optimization technique and new features of "OptiLayer" design software", Visual Communications and Image Processing; vol. 2253, Nov. 4, 1994, Total 11 pages, XP007915354.

(Continued)

*Primary Examiner* — Brandi N Thomas
(74) *Attorney, Agent, or Firm* — Sughrue Mion, PLLC

(57) ABSTRACT

Provided are a multilayer thin-film structure and a phase shifting device using the same. The multilayer thin-film structure includes at least one crystallization preventing layer and at least one dielectric layer that are alternately stacked. The at least one crystallization preventing layer includes an amorphous material, and a thickness of the at least one crystallization preventing layer is less than a thickness of the at least one dielectric layer.

22 Claims, 12 Drawing Sheets

(58) Field of Classification Search
CPC ........ B32B 2264/108; B32B 2307/408; B32B 2307/41; B32B 2307/416; B32B 2307/518; B32B 2307/71; B32B 2307/748; B32B 2410/00; B32B 2457/00; B32B 2590/00; B32B 27/12; B32B 27/38; B32B 5/022; B32B 7/06; B32B 7/12; B32B 2250/02; B32B 2250/03; B32B 2250/40; B32B 2307/308; B32B 2307/40; B32B 2307/412; B32B 2307/734; B32B 2333/00; B32B 2367/00; B32B 2457/12; B32B 2457/14; B32B 27/30; B32B 3/263; B32B 3/266; B32B 3/30; B32B 37/15; B32B 37/153; B32B 38/10; B32B 7/04; B32B 2037/0092; B32B 2255/10; B32B 2255/20; B32B 2255/205; B32B 2307/7244; B32B 2307/7246; B32B 2307/732; B32B 2457/206; B32B 2553/00; B32B 27/283; B32B 27/306; B32B 3/04; B32B 37/02; B32B 37/025; B32B 7/035; G02B 5/0891; G02B 5/0816; G02B 17/0647; G02B 27/0043; G02B 3/00; G02B 5/00; G02B 5/08; G02B 5/285; G02B 7/1815; G02B 1/14; G02B 5/0808; G02B 1/002; G02B 1/10; G02B 5/003; G02B 5/1809; G02B 5/1866; G02B 5/26; G02B 23/02; G02B 26/001; G02B 5/0858

See application file for complete search history.

(56) References Cited

U.S. PATENT DOCUMENTS

| | | | |
|---|---|---|---|
| 7,223,124 B2 | 5/2007 | Nakamura et al. | |
| 2002/0088970 A1 | 7/2002 | Yu et al. | |
| 2005/0219724 A1* | 10/2005 | Teramoto | G02B 1/113 |
| | | | 359/883 |
| 2006/0125048 A1 | 6/2006 | Miki | |
| 2007/0082205 A1 | 4/2007 | Anzaki et al. | |
| 2007/0102742 A1 | 5/2007 | Kil et al. | |
| 2007/0290222 A1 | 12/2007 | Huang | |
| 2008/0088932 A1 | 4/2008 | Cho et al. | |
| 2008/0160427 A1 | 7/2008 | Kim | |
| 2009/0147161 A1* | 6/2009 | Ito | G02F 1/29 |
| | | | 349/25 |
| 2011/0048769 A1 | 3/2011 | Fujiwara | |
| 2011/0204454 A1 | 8/2011 | Chambers et al. | |
| 2015/0168618 A1 | 6/2015 | Nakajima | |
| 2015/0228710 A1 | 8/2015 | Rui | |
| 2018/0045865 A1 | 2/2018 | Banerjee et al. | |
| 2019/0079383 A1* | 3/2019 | Ikebe | G03F 1/32 |

FOREIGN PATENT DOCUMENTS

| | | |
|---|---|---|
| JP | 2007-10743 A | 1/2007 |
| JP | 5217100 B2 | 6/2013 |
| JP | 5433943 B2 | 3/2014 |
| KR | 10-2005-0092368 A | 9/2005 |
| WO | 2004/086104 A1 | 10/2004 |

OTHER PUBLICATIONS

Amir Arbabi et al., "Subwavelength-thick lenses with high numerical apertures and large efficiency based on high-contrast transmitarrays", Nature Communications, May 7, 2015, pp. 1-6 (6 pages total).

Anonymous, "Power (intensity) reflection and transmission coefficients", Wikipedia, retrieved on Jun. 11, 2019, pp. 1-2 (2 pages total).

Communication dated Jan. 21, 2020, issued by the European Patent Office in counterpart European Application No. 19178749.8.

Mohammadreza Khorasaninejad et al., "Metalenses at visible wavelengths: Diffraction-limited focusing and subwavelength resolution imaging", Applied Optics, vol. 352, No. 6290, Jun. 3, 2016, pp. 1190-1194 (6 pages total).

Notice of Allowance dated Jun. 8, 2021 by the U.S. Patent and Trademark Office in U.S. Appl. No. 16/406,677.

Non-Final Office Action dated Jan. 11, 2021 by the U.S. Patent and Trademark Office in U.S. Appl. No. 16/406,677.

Communication dated Feb. 3, 2022, issued by the European Patent Office in European Application No. 19178749.8.

Communication dated Sep. 18, 2023, issued by the Korean Intellectual Property Office in Korean Patent Application No. 10-2018-0114373.

Communication dated Oct. 27, 2023, issued by the European Patent Office in European Application No. 19178749.8.

* cited by examiner

20c

20d

MULTILAYER THIN-FILM STRUCTURE AND PHASE SHIFTING DEVICE USING THE SAME

CROSS-REFERENCE TO RELATED APPLICATION

This application is a Continuation Application of U.S. application Ser. No. 16/406,677, filed May 8, 2019, which claims priority to Korean Patent Application No. 10-2018-0114373, filed on Sep. 21, 2018, in the Korean Intellectual Property Office, the disclosure of which is incorporated by reference herein in its entirety.

BACKGROUND

1. Field

Example embodiments of the present disclosure relate to a multilayer thin-film structure and a phase shifting device using the multilayer thin-film structure, and more particularly, to a multilayer thin-film structure in which a material having a high refractive index and a low extinction coefficient with respect to visible light is stacked without being crystallized and a phase shifting device operating in a visible light band using the multilayer thin-film structure.

2. Description of the Related Art

An optical device (e.g., a metamaterial) with unique electrical and optical properties that cannot be found in nature may be manufactured by using an array of dielectric structures having a size that is less than the wavelength of light. In order to manufacture such an optical device, a material having a high refractive index and a low absorption rate (i.e., a low extinction coefficient) at the wavelength of corresponding light is used. For example, silicon (Si) having a refractive index of at least 3.5 and an extinction coefficient of $1 \times 10^{-5}$ or less is mainly used in an infrared band of a wavelength of 1550 nm. However, it is difficult to use Si in an optical device for visible light because the light absorption of Si is large at short wavelengths in the visible light band.

On the other hand, in a material having a low extinction coefficient and a high refractive index in a visible light band, a crystalline phase having a large surface roughness is more thermodynamically stable than an amorphous phase, and therefore crystallization is facilitated when the thickness of a deposited film becomes thick. As a result of the crystallization, surface roughness of the material becomes large and patterning using a conventional semiconductor process including exposure and etching processes becomes difficult.

SUMMARY

In accordance with an aspect of an example embodiment, a multilayer thin-film structure includes a crystallization preventing layer; and a dielectric layer on the crystallization preventing layer, wherein the crystallization preventing layer includes an amorphous material, a thickness of the crystallization preventing layer is less than a thickness of the dielectric layer, and the crystallization preventing layer and the dielectric layer are repeatedly stacked at least once.

The multilayer thin-film structure may further include: an amorphous substrate, wherein the dielectric layer may be on the amorphous substrate, and the crystallization preventing layer and the dielectric layer may be alternately stacked on the dielectric layer.

The multilayer thin-film structure may further include: a crystalline substrate, wherein the crystallization preventing layer and the dielectric layer may be alternately stacked on the substrate.

A refractive index of the dielectric layer in a visible light band may be 2.4 or more and an extinction coefficient of the dielectric layer may be $1 \times 10^{-5}$ or less.

An extinction coefficient of the crystallization preventing layer in the visible light band may be $1 \times 10^{-5}$ or less.

The dielectric layer may include an amorphous material or a crystalline material having a grain size of 100 nm or less.

The thickness of the dielectric layer may be within a range of 50 nm to 500 nm, and the thickness of the crystallization preventing layer is more than 0 nm and 10 nm or less.

A sum of thicknesses of crystallization preventing layers may be 5% or less of a total thickness of dielectric layers and crystallization preventing layers.

The crystallization preventing layer comprises amorphous silicon oxide ($SiO_2$), amorphous silicon nitride ($Si_3N_4$), or amorphous aluminum oxide ($Al_2O_3$).

The dielectric layer may include amorphous titanium oxide ($TiO_2$), amorphous gallium phosphide (GaP), amorphous gallium nitride (GaN), or amorphous aluminum arsenide (AlAs).

A root mean square (RMS) value of surface roughness of an uppermost surface of the multilayer thin-film structure is 2.5 nm or less.

In accordance with an aspect of an example embodiment, a phase shifting device includes: a plurality of phase shift patterns having a size less than the wavelength of visible light, wherein each of the phase shift patterns includes a crystallization preventing layer and a dielectric layer that are stacked repeatedly at least once, wherein the crystallization preventing layer includes an amorphous material, and a thickness of the crystallization preventing layer is less than a thickness of the dielectric layer.

Each of the phase shift patterns may have the form of a bar or a slit extending in a first direction, and the plurality of phase shift patterns may be one-dimensionally arranged in a second direction perpendicular to the first direction.

The plurality of phase shift patterns may be two-dimensionally arranged and each of the phase shift patterns may have a square, rectangular, circular, or oval shape.

The phase shifting device may be applied to a flat lens, a planar color filter, a flat beam deflector, or a planar spectroscope in a visible light band or a near-infrared band.

In accordance with an aspect of an example embodiment, a multilayer thin-film structure includes at least one crystallization preventing layer; and at least one dielectric layer, wherein the at least one crystallization preventing layer comprises an amorphous material, wherein a thickness of the at least one crystallization preventing layer is less than a thickness of the at least one dielectric layer, and wherein the at least one crystallization preventing layer and the at least one dielectric layer are alternately stacked.

The multilayer thin-film structure may further include an amorphous substrate, wherein a lowermost dielectric layer from among the at least one dielectric layer is disposed on the amorphous substrate.

The multilayer thin-film structure may further include a crystalline substrate, wherein the at least one crystallization preventing layer and the at least one dielectric layer are alternately stacked on the crystalline substrate.

A refractive index of the at least one dielectric layer in a visible light band may be greater than or equal to 2.4 and an extinction coefficient of the at least one dielectric layer in the visible light band is less than or equal to $1 \times 10^{-5}$.

An extinction coefficient of the at least one crystallization preventing layer in the visible light band may be less than or equal to $1 \times 10^{-5}$.

The at least one dielectric layer may include a crystalline material having a grain size that is less than or equal to 100 nm or an amorphous material.

The thickness of the at least one dielectric layer may be within a range of 50 nm to 500 nm, and the thickness of the at least one crystallization preventing layer may be less than or equal to 10 nm.

A sum of thicknesses of all of the at least one crystallization preventing layer may be less than or equal to 5% a total thickness of all of the at least one dielectric layer and all of the at least one crystallization preventing layer.

The at least one crystallization preventing layer may include amorphous silicon oxide ($SiO_2$), amorphous silicon nitride ($Si_3N_4$), or amorphous aluminum oxide ($Al_2O_3$).

The at least one dielectric layer may include amorphous titanium oxide ($TiO_2$), amorphous gallium phosphide (GaP), amorphous gallium nitride (GaN), or amorphous aluminum arsenide (AlAs).

A root mean square value of surface roughness of an uppermost surface of the multilayer thin-film structure may be less than or equal to 2.5 nm.

In accordance with an aspect of an example embodiment, a phase shifting device includes a plurality of phase shift patterns, each of the plurality of phase shift patterns having at least one dimension smaller than a wavelength of visible light, wherein each of the plurality of phase shift patterns comprises at least one crystallization preventing layer and at least one dielectric layer that are alternately stacked, wherein the at least one crystallization preventing layer comprises an amorphous material, and wherein a thickness of the at least one crystallization preventing layer is less than a thickness of the at least one dielectric layer.

The phase shifting device may further include an amorphous substrate, wherein each phase shift pattern from among the plurality of phase shift patterns comprises a lowermost dielectric layer from among the at least one dielectric layer, the lowermost dielectric layer being stacked on the amorphous substrate.

The phase shifting device may further include a crystalline substrate, and each phase shift pattern from among the plurality of phase shift patterns comprises the at least one crystallization preventing layer and the at least one dielectric layer that are alternately stacked on the crystalline substrate.

A refractive index of the at least one dielectric layer in a visible light band may be greater than or equal to 2.4 and an extinction coefficient of the at least one dielectric layer in the visible light band may be less than or equal to $1 \times 10^{-5}$.

An extinction coefficient of the at least one crystallization preventing layer in the visible light band may be less than or equal to $1 \times 10^{-5}$.

The at least one dielectric layer may include a crystalline material having a grain size that is less than or equal to 100 nm or an amorphous material.

The thickness of the at least one dielectric layer may be within a range of 50 nm to 500 nm, and the thickness of the at least one crystallization preventing layer may be less than or equal to 10 nm.

A sum of thicknesses of all of the at least one crystallization preventing layer present in each phase shift pattern from among the plurality of phase shift patterns may be less than or equal to 5% of a total thickness of all of the at least one dielectric layer and all of the at least one crystallization preventing layer present in each shift pattern from among the plurality of phase shift patterns.

The at least one crystallization preventing layer may include amorphous silicon oxide ($SiO_2$), amorphous silicon nitride ($Si_3N_4$), or amorphous aluminum oxide ($Al_2O_3$), and the at least one dielectric layer may include amorphous titanium oxide ($TiO_2$), amorphous gallium phosphide (GaP), amorphous gallium nitride (GaN), or amorphous aluminum arsenide (AlAs).

A root mean square value of surface roughness of an uppermost surface of each of the plurality of phase shift patterns may be less than or equal to 2.5 nm.

Each phase shift pattern from among the plurality of phase shift patterns may include a bar or a slit extending in a first direction, and the plurality of phase shift patterns may be arranged in a second direction perpendicular to the first direction.

The plurality of phase shift patterns may be two-dimensionally arranged and each phase shift pattern from among the plurality of phase shift patterns may have a square, rectangular, circular, or oval shape.

The phase shifting device may be applied to a flat lens, a planar color filter, a flat beam deflector, or a planar spectroscope, and the phase shifting device may be configured to shift a phase of incident light in a visible light band or a near-infrared band.

In accordance with an aspect of an example embodiment, a thin-film metamaterial includes alternately stacked dielectric amorphous layers and crystallization preventing amorphous layers, wherein a thickness of each of the dielectric amorphous layers is less than a thickness at which the dielectric amorphous layers crystallize.

A thickness of each of the crystallization preventing amorphous layers may be less than the thickness of each of the dielectric amorphous layers.

The thickness of each of the crystallization preventing amorphous layers may be less than or equal to 10 nm, and the thickness of each of the dielectric amorphous layers may be within a range of 50 nm to 500 nm.

A refractive index in a visible light band of the dielectric amorphous layers may be greater than or equal to 2.4 and an extinction coefficient in the visible light band of the dielectric amorphous layers may be less than or equal to $1 \times 10^{-5}$.

An extinction coefficient in the visible light band of the crystallization preventing amorphous layers may be less than or equal to $1 \times 10^{-5}$.

An uppermost layer of the thin-film metamaterial may be a dielectric amorphous layer, and a root mean square value of a surface roughness of the uppermost layer may be less than or equal to 2.5 nm.

The thin-film metamaterial may further include a plurality of structures formed on a substrate, each of the plurality of structures including the alternately stacked dielectric amorphous layers and crystallization preventing amorphous layers.

A width of each of the plurality of structures may be less than a wavelength of visible light.

An interval between each of the plurality of structures may be less than a wavelength of visible light.

BRIEF DESCRIPTION OF THE DRAWINGS

The above and/or other aspects will become apparent and more readily appreciated from the following description of example embodiments, taken in conjunction with the accompanying drawings, in which.

DETAILED DESCRIPTION

Figure 1:
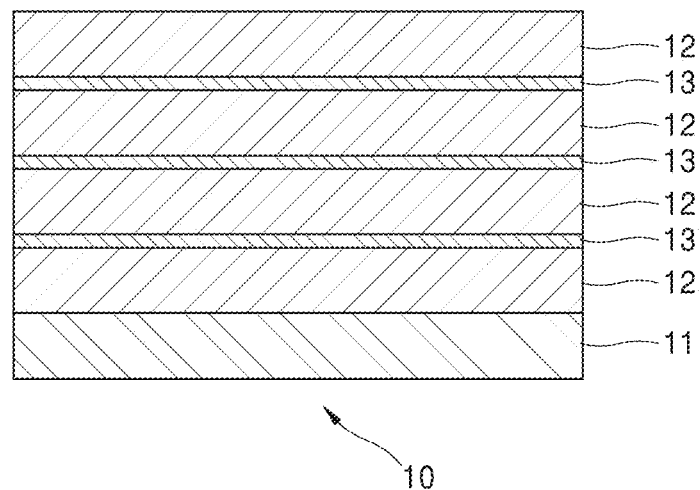
FIG. 1 is a cross-sectional view of a configuration of a multilayer thin-film structure according to an example embodiment.

Hereinafter, a multilayer thin-film structure and a phase shifting device using the same will be described in detail with reference to the accompanying drawings. The same reference numerals refer to the same elements throughout. In the drawings, the sizes of constituent elements may be exaggerated for clarity. The embodiments described below are merely examples, and various modifications may be possible. In a layer structure described below, an expression such as "above" or "on" may include not only the meaning of "immediately on/under/to the left/to the right in a contact manner", but also the meaning of "on/under/to the left/to the right in a non-contact manner".

FIG. 1 is a cross-sectional view of a configuration of a multilayer thin-film structure 10 according to an example embodiment. Referring to FIG. 1, the multilayer thin-film structure 10 according to an example embodiment includes a structure in which crystallization preventing layers 13 (i.e., crystallization preventing amorphous layers) and transparent dielectric layers 12 (i.e., dielectric amorphous layers) are alternately stacked. The transparent dielectric layers 12 may have a high refractive index. In the present example embodiment, the high refractive index may be defined as a refractive index of about 2.4 or more, which is higher by about 1.4 or more than the refractive index of air in a visible light band (450 nm to 750 nm) or a near infrared band (750 nm to 1000 nm). The term "transparent" may mean that an extinction coefficient is $1\times10^{-5}$ or less in the visible infrared band or the near-infrared band. The material of a transparent dielectric layer 12 of high refractive index satisfying these conditions may include, for example, titanium oxide ($TiO_2$), gallium phosphide (GaP), gallium nitride (GaN), or aluminum arsenide (AlAs). All of these materials have an extinction coefficient of $1\times10^{-5}$ or less at a wavelength of 550 nm. In addition, the refractive index of $TiO_2$ is about 2.453 at a wavelength of 550 nm, the refractive index of GaP is about 3.450 at a wavelength of 550 nm, the refractive index of GaN is about 2.408 at a wavelength of 550 nm, and the refractive index of AlAs is about 3.248 at a wavelength of 550 nm.

As a thickness of materials such as $TiO_2$, GaP, GaN, AlAs, and the like increases, a root means square (RMS) value of a surface roughness also increases due to crystallization. Therefore, it is difficult to manufacture a nanostructure having a critical dimension of 100 nm or less. Crystallization of the dielectric layer 12 may be suppressed by inserting crystallization preventing layer 13 between the dielectric layers 12. The crystallization preventing layer 13 may include a material having an extinction coefficient of $1\times10^{-5}$ or less in a visible light band or a near-infrared band while stably maintaining an amorphous state instead of a crystalline state. For example, the material of the crystallization preventing layer 13 satisfying these conditions may include amorphous silicon oxide ($SiO_2$), amorphous silicon nitride ($Si_3N_4$), or amorphous aluminum oxide ($Al_2O_3$).

Alternatively, the crystallization preventing layer 13 may be formed by performing ion implantation on a surface of the dielectric layer 12. For example, after the dielectric layer 12 is formed, a noble element such as argon (Ar), krypton (Kr), xenon (Xe), neon (Ne), or the like, a Group IV element such as silicon (Si), germanium (Ge), or the like, a Group III element such as boron (B), gallium (Ga), indium (In), or the like, or a Group V element such as nitrogen (N), phosphorus (P), arsenide (As), antimony (Sb), or the like is ion-implanted into the surface of the dielectric layer 12. Then, the above-mentioned ions are intensively distributed on the surface of the dielectric layer 12 to form the crystallization preventing layer 13. Next, another dielectric layer 12 may be deposited again onto the ion-implanted surface of the previous dielectric layer 12.

The multilayer thin-film structure 10 may also include an amorphous substrate 11. For example, the substrate 11 may include glass, quartz, fused silica, or amorphous $Al_2O_3$.

When the substrate 11 includes an amorphous material, the dielectric layer 12 may be deposited first on the substrate 11. The crystallization preventing layer 13 may be deposited on the dielectric layer 12, and the dielectric layer 12 may be deposited again on the crystallization preventing layer 13. In this manner, the dielectric layers 12 and the crystallization preventing layers 13 may be alternately stacked. The deposition method of the dielectric layer 12 and the crystallization preventing layer 13 may include, for example, sputtering, E-beam evaporation, plasma-enhanced chemical vapor deposition (PECVD) metalorganic vapor phase epitaxy sputtering (MOCVD), atomic layer deposition (ALD), and the like. Alternatively, the crystallization preventing layer 13 may be formed by implanting ions into the surface of the dielectric layer 12 by ion implantation after the dielectric layer 12 is deposited by the above-described vapor deposition methods.

Although FIG. 1 illustratively shows that four dielectric layers 12 and three crystallization preventing layers 13 are stacked on the substrate 11, this is only an example. For example, the multilayer thin-film structure 10 may include only two dielectric layers 12 and only one crystallization preventing layer 13, or may include only three dielectric layers 12 and only two crystallization preventing layers 13. In addition, a larger number of dielectric layers 12 and crystallization preventing layers 13 than those shown in FIG. 1 may be stacked. For example, a total thickness of the dielectric layers 12 and the crystallization preventing layers 13 may be within a range of about 200 nm to about 2000 nm, and the number of dielectric layers 12 and the number of crystallization preventing layers 13 may be determined considering the thickness of each dielectric layer 12 and the thickness of each crystallization preventing layer 13.

The dielectric layers 12 may be crystallized during the stacking process if the thickness of the dielectric layers 12 is too large. Therefore, the dielectric layer 12 may be stacked only to the extent that the dielectric layer 12 is not crystallized, and then the crystallization preventing layer 13 may be stacked thereon. For example, the thickness of one dielectric layer 12 may be within a range of about 50 nm to about 500 nm. The thickness of one dielectric layer 12 may be less than a thickness at which the dielectric layer is crystallized.

Figure 2:
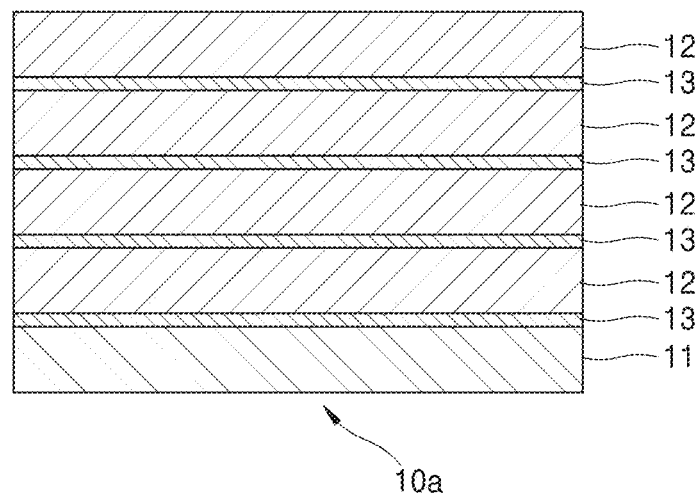
FIG. 2 is a cross-sectional view of a configuration of a multilayer thin-film structure according to an example embodiment.

FIG. 2 is a cross-sectional view of a configuration of a multilayer thin-film structure 10a according to another example embodiment. Referring to FIG. 2, the multilayer thin-film structure 10a may include a substrate 11 formed of a crystalline material. In this case, when the dielectric layer 12 is directly stacked on the substrate 11, the dielectric layer 12 itself may also be crystallized. Therefore, the determination of whether to stack the crystallization preventing layer 13 or the dielectric layer 12 directly on the substrate 11 may depend on the type of the substrate 11. When the substrate 11 is crystalline, as shown in FIG. 2, the crystallization preventing layer 13 is first deposited on the substrate 11, and the dielectric layer 12 is deposited thereon.

Regardless of the type of the substrate 11, the dielectric layer 12 is always located at the top of the multilayer thin-film structure 10 shown in FIG. 1 and the multilayer thin-film structure 10a shown in FIG. 2. Therefore, when the substrate 11 is amorphous, the number of dielectric layers 12 is one more than the number of crystallization-preventing layers 13. When the substrate 11 is crystalline, the number of dielectric layers 12 is identical to the number of crystallization preventing layers 13.

Figure 3:
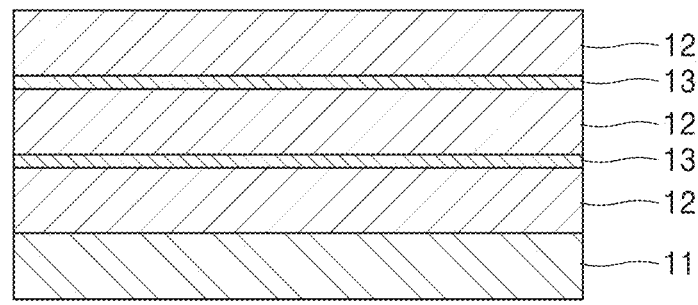
FIG. 3 is a cross-sectional view of an example of fabrication of the multilayer thin-film structure shown in FIG. 1.

Since a refractive index of the crystallization preventing layer 13 is less than that of the dielectric layer 12, the multilayer thin-film structures 10 and 10a may lose high refractive index characteristics when the ratio of the crystallization preventing layer 13 in the multilayer thin-film structures 10 and 10a is increased. The multilayer thin-film structure 10 is simulated in order to examine an influence of the dielectric layer 12. For example, FIG. 3 is a cross-sectional view of an example of fabrication of the multilayer thin-film structure 10 shown in FIG. 1. Referring to FIG. 3, three dielectric layers 12 and two crystallization preventing layers 13 are alternately stacked on a glass substrate 11. Here, it is assumed that the dielectric layer 12 has a thickness of 200 nm and includes $TiO_2$, and the crystallization preventing layer 13 includes $SiO_2$.

Figure 4:
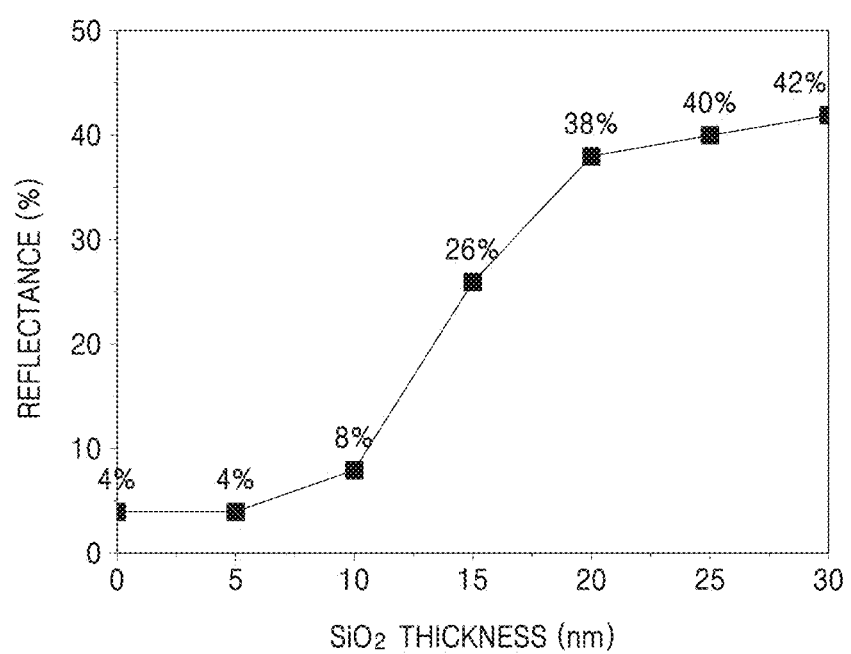
FIG. 4 is a graph showing a change in reflectivity according to the thickness of a crystallization preventing layer in the multilayer thin-film structure shown in FIG. 3.

FIG. 4 is a graph showing a change in reflectivity according to a thickness of the crystallization preventing layer 13 in the multilayer thin-film structure shown in FIG. 3. Referring to FIG. 4, when there is no crystallization preventing layer 13, that is, when the thickness of the crystallization preventing layer 13 is 0 nm, the reflectivity of the multilayer thin-film structure 10 is about 4%. When the thickness of the crystallization preventing layer 13 is 5 nm, the reflectivity of the multilayer thin-film structure 10 is maintained at about 4%. However, as the thickness of the crystallization preventing layer 13 further increases, the reflectivity of the multilayer thin-film structure 10 gradually increases. In particular, it can be seen that the reflectivity of the multilayer thin-film structure 10 greatly increases from about 8% to 38% as the thickness of the crystallization preventing layer 13 increases from 10 nm to 20 nm. As a result, when the ratio of the crystallization preventing layer 13 in the multilayer thin-film structures 10 and 10a is increased, not only do the multilayer thin-film structures 10 and 10a lose high refractive index characteristics, but also the light transmittance of the multilayer thin-film structures 10 and 10a is lowered.

In consideration of these results, the thickness of the crystallization preventing layer 13 may be much less than the thickness of one dielectric layer 12. For example, the thickness of the crystallization preventing layer 13 may be more than 0 nm and not more than about 10 nm. In addition, a sum of thicknesses of all the crystallization preventing layers 13 in the structure may be limited to 5% or less of a total thickness of all the dielectric layers 12 and all the crystallization preventing layers 13 in the structure.

Figure 5:
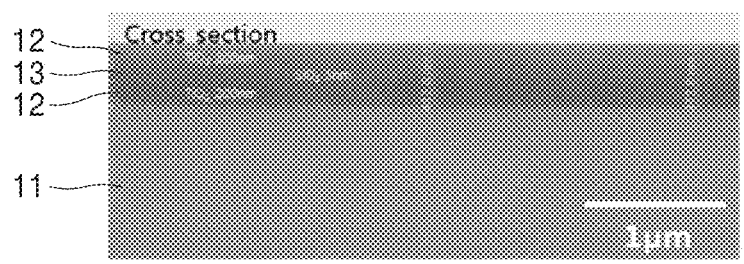
FIG. 5 is a cross-sectional photograph of an actually manufactured multilayer thin-film structure.

FIG. 5 is a cross-sectional photograph of an actually manufactured multilayer thin-film structure 10. Referring to FIG. 5, $TiO_2$ is deposited as the dielectric layer 12 on the glass substrate 11 to a thickness of about 200 nm, $SiO_2$ is deposited as the crystallization preventing layer 13 to a thickness of about 5 nm, and another layer of $TiO_2$ is deposited thereon as the dielectric layer 12 to a thickness of about 200 nm.

Figure 6:
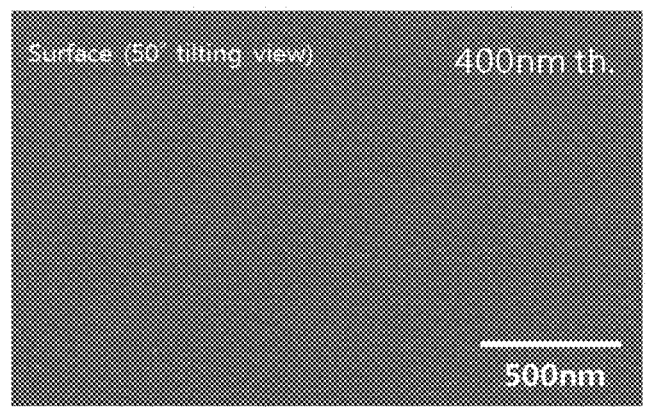
FIG. 6 is a photograph showing an upper surface of the multilayer thin-film structure shown in FIG. 5.

Furthermore, FIG. 6 is a photograph showing an upper surface of the multilayer thin-film structure 10 shown in FIG. 5. The photograph shown in FIG. 6 shows an uppermost surface of the multilayer thin-film structure 10 obliquely taken at an angle of about 50° with respect to the surface normal. Referring to FIG. 6, it can be seen that the uppermost surface of the multilayer thin-film structure 10 is very smooth.

Figure 7:
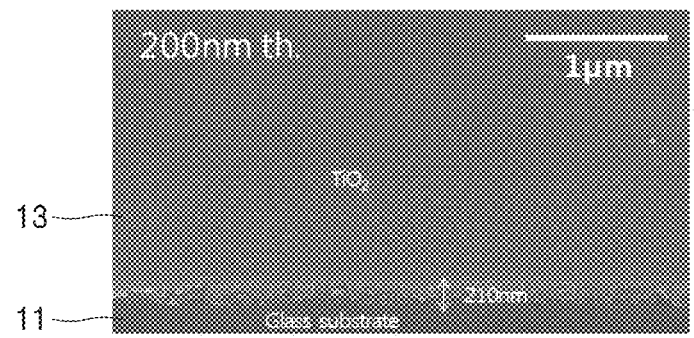
FIG. 7 is a photograph showing a cross-section and an upper surface of a thin-film structure according to a comparative example.

FIG. 7 is a photograph, which is obliquely taken at an angle of about 50°, showing both a cross-section and an upper surface of a thin-film structure according to a comparative example. In the photograph shown in FIG. 7, $TiO_2$ is deposited on a glass substrate to a thickness of about 210 nm to form the thin-film structure according to the comparative example. Referring to FIG. 7, it can be seen that $TiO_2$ is not crystallized up to a thickness of 210 nm, and an upper surface of the thin-film structure is smooth.

Figure 8:
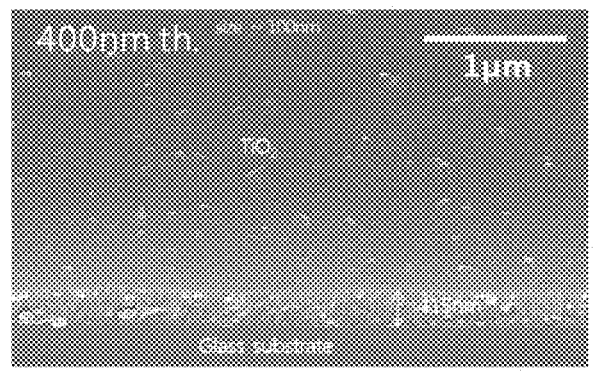
FIG. 8 is a photograph showing a cross-section and an upper surface of the thin-film structure shown in FIG. 7 after increasing the thickness of the thin-film structure.

FIG. 8 is a photograph, which is obliquely taken at an angle of about 50°, showing both a cross-section and an upper surface of the thin-film structure shown in FIG. 7 after increasing the thickness of the thin-film structure. Referring to FIG. 8, when $TiO_2$ is continuously deposited and the thickness becomes about 415 nm, coarse crystal grains are seen on an upper surface of $TiO_2$ because $TiO_2$ is partially crystallized as a result of the increased thickness of the $TiO_2$.

As described above, crystallization of materials of the dielectric layer 12 may be prevented while maintaining the thickness of the multilayer thin-film structures 10 and 10a by inserting the crystallization preventing layer 13 between dielectric layers 12. Therefore, the material of the dielectric layer 12 in the multilayer thin-film structures 10 and 10a according to the present example embodiment may maintain an amorphous state. Alternatively, the material of the dielectric layer 12 may be partially crystallized, but the size of crystal grains may be suppressed to 100 nm or less. Then, RMS values of surface roughnesses of uppermost surfaces of the multilayer thin-film structures 10 and 10a may be maintained at 2.5 nm or less.

Figure 9:
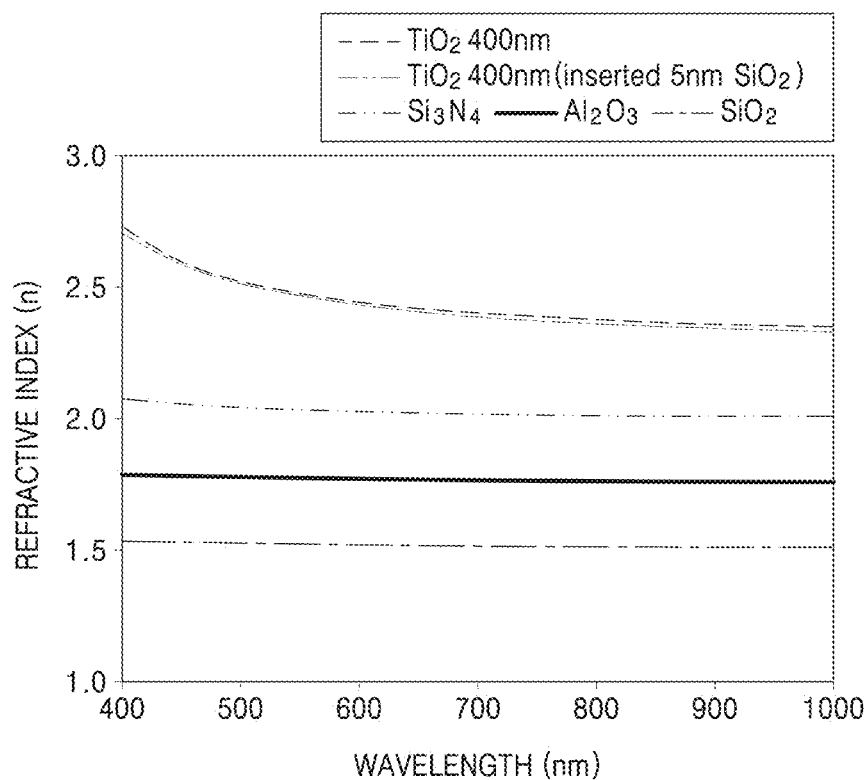
FIG. 9 is a graph illustrating a refractive index of a multilayer thin-film structure according to an example embodiment.

FIG. 9 is a graph illustrating a refractive index of the multilayer thin-film structure 10 according to an example embodiment. The multilayer thin-film structure 10 has a structure in which 5 nm thick $SiO_2$ is inserted between $TiO_2$ having a total thickness of 400 nm. FIG. 9 shows refractive indices of $Si_3N_4$, $Al_2O_3$, $SiO_2$, and $TiO_2$, none of which includes the crystallization preventing layer 13, together for comparison. Referring to the graph of FIG. 9, it can be seen that the refractive index of the multilayer thin-film structure 10 is much greater than the refractive indices of $Si_3N_4$, $Al_2O_3$, and $SiO_2$ and is substantially similar to the refractive index of $TiO_2$ that does not include the crystallization preventing layer 13. For example, the refractive index of the multilayer thin-film structure 10 at a wavelength of 550 nm is only 0.013 less than the refractive index of $TiO_2$. Therefore, even when the crystallization preventing layer 13 is interposed between the dielectric layers 12, it can be seen that when the thickness of the crystallization preventing layer 13 is small, high refractive index characteristics are maintained.

As described above, the multilayer thin-film structures 10 and 10a may have a sufficiently high refractive index and a sufficiently low extinction coefficient in a visible light band or a near-infrared band. Further, since the dielectric layer 12 is entirely or almost entirely amorphous, the surface roughness of an upper surface of the multilayer thin-film structures 10 and 10a may be sufficiently low. Thus, the multilayer thin-film structures 10 and 10a may be patterned into a nanoscale pattern using a conventional semiconductor process including exposure and etching. By patterning the multilayer thin-film structures 10 and 10a into the nanoscale pattern, it is possible to manufacture various optical devices operating in the visible light band or the near-infrared band.

Figure 10:
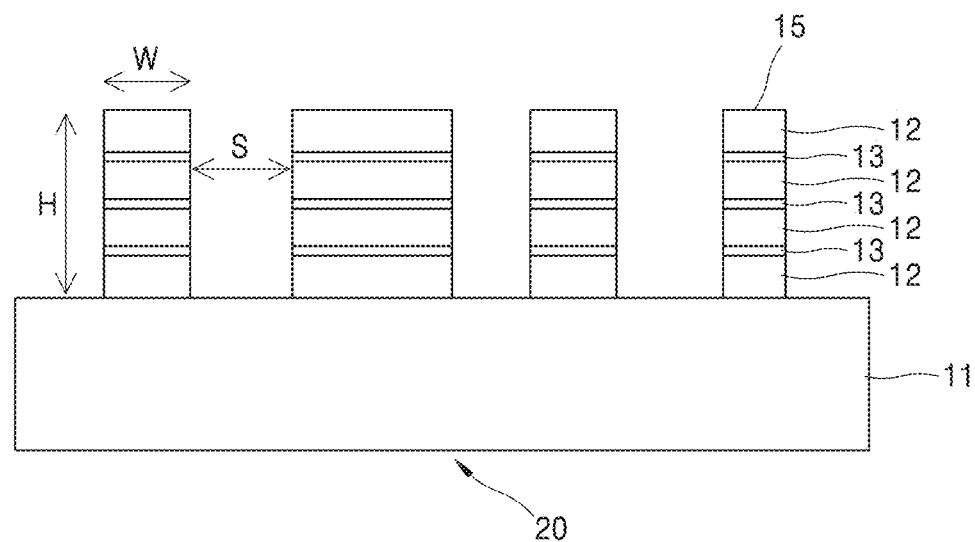
FIG. 10 is a cross-sectional view of a structure of a phase shifting device according to an example embodiment.

For example, FIG. 10 is a cross-sectional view of a structure of a phase shifting device 20 according to an example embodiment. Referring to FIG. 10, the phase shifting device 20 may include a plurality of phase shift patterns 15 (i.e., structures) having at least one dimension smaller than the wavelength of visible light. Here, the plurality of phase shift patterns 15 may be formed by patterning the multilayer thin-film structures 10 and 10a. Therefore, each of the phase shift patterns 15 may include the crystallization preventing layers 13 and the transparent dielectric layers 12 of high refractive index, which are stacked repeatedly at least once.

As described above, when the substrate 11 is an amorphous substrate, each phase shift pattern 15 includes a multilayer thin-film structure in which the dielectric layers 12 and the crystallization preventing layers 13 are repeatedly stacked in this order on the substrate 11 and the dielectric layer 12 is arranged on the top surface. When the substrate 11 is a crystalline substrate, each phase shift pattern 15 includes a multilayer thin-film structure in which the crystallization preventing layers 13 and the dielectric layers 12 are repeatedly stacked on the substrate 11 in this order. In addition, the structure of the phase shift patterns 15 may be the same as the structure of the multilayer thin-film structures 10 and 10a including the dielectric layers 12 and the crystallization preventing layers 13.

A width W of each phase shift pattern 15, an interval S between each two adjacent phase shift patterns 15, and a height H of each phase shift pattern 15 may be variously determined depending on an application of the phase shifting device 20 and the wavelength of incident light. Either or both of the width W of each phase shift pattern 15 and the interval S between two adjacent phase shift patterns 15 may be less than the wavelength of visible light so as to operate in the visible light band or the near-infrared band. For example, the width W of each phase shift pattern 15 and the spacing S between two adjacent phase shift patterns 15 may be within a range of 100 nm to 700 nm. In addition, the height H of each phase shift pattern 15 may be within a range of 200 nm to about 2000 nm.

Depending on the desired optical characteristics of a phase shifting device 20 to be formed, the plurality of phase shift patterns 15 may have various shapes and arrangements. The width W of each phase shift pattern 15 or the interval S between two adjacent phase shift patterns 15 may vary locally depending on the position on the phase shifting device 20. For example, the width W of each phase shift pattern 15 or the interval S between two adjacent phase shift patterns 15 may gradually increase or decrease, or may vary irregularly. The plurality of phase shift patterns 15 may be arranged non-periodically within the entire area of the phase shifting device 20 or locally periodically within a specific area on the phase shifting device 20.

Figure 11:
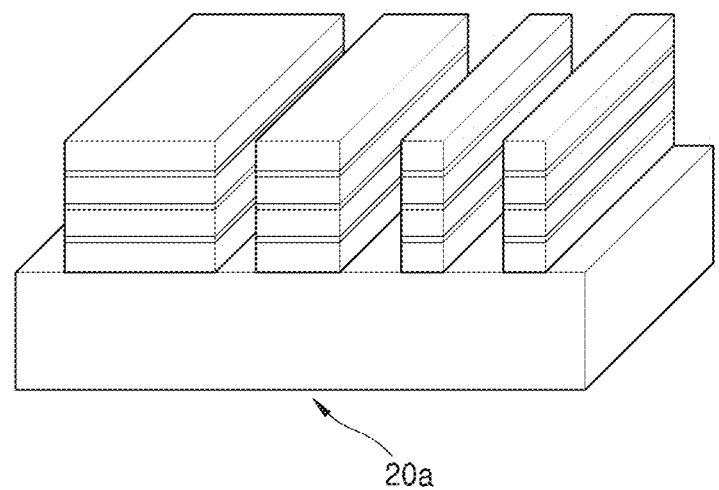
FIG. 11 is a perspective view of a form of exemplary phase shift patterns of a phase shifting device according to an example embodiment.

For example, FIG. 11 is a perspective view of a form of exemplary phase shift patterns 15 of a phase shifting device 20a according to an example embodiment. Referring to FIG. 11, each of the phase shift patterns 15 may have the form of a bar extending in a first direction. The plurality of phase shift patterns 15 may be arranged in a second direction perpendicular to the first direction. The plurality of phase shift patterns 15 may have different widths W. FIG. 11 shows that the widths W of the phase shift patterns 15 are gradually reduced in the second direction, but this is only an example. Depending on other designs, the widths W of the phase shift patterns 15 may change periodically or irregularly. Also, the plurality of phase shift patterns 15 may have an identical width W, and the interval S between the phase shift patterns 15 may instead be different.

Figure 12:
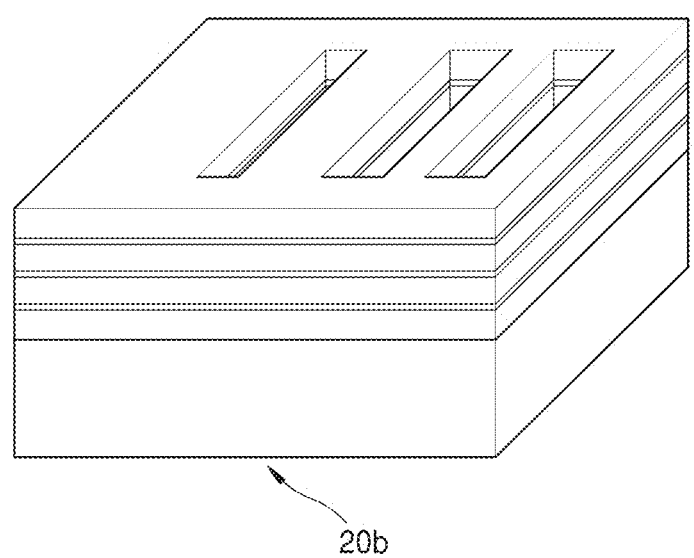
FIG. 12 is a perspective view of a form of exemplary phase shift patterns of a phase shifting device according to an example embodiment.

FIG. 12 is a perspective view of a form of exemplary phase shift patterns 15 of a phase shifting device 20b according to another example embodiment. Referring to FIG. 12, in contrast to the bar form shown in FIG. 11, each of the phase shift patterns 15 may have the form of a slit extending in a first direction. The plurality of phase shift patterns 15 may be arranged in a second direction perpendicular to the first direction. For example, the phase shifting device 20a shown in FIG. 12 may be manufactured by forming a straight groove in the multilayer thin-film structures 10 and 10a via a general semiconductor process.

Figure 13:
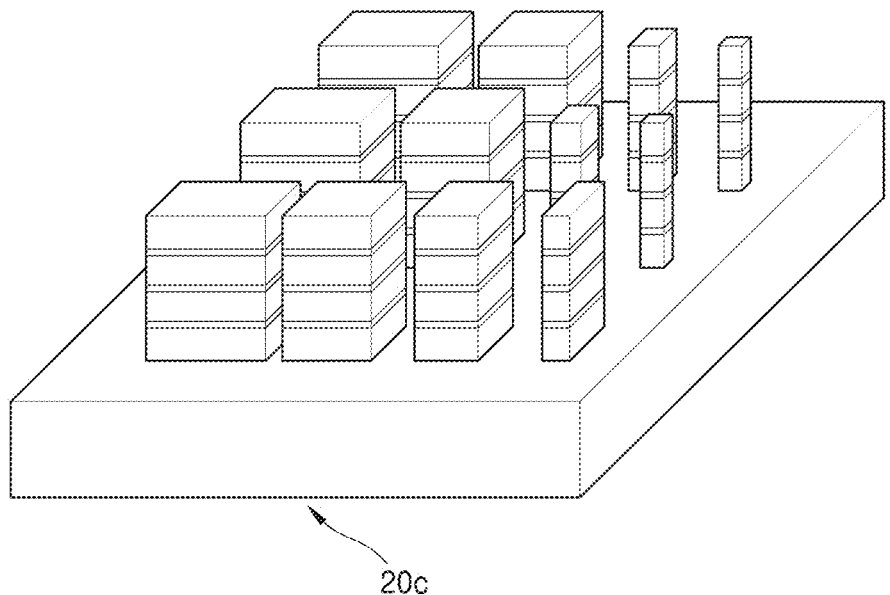
FIG. 13 is a perspective view of a form of exemplary phase shift patterns of a phase shifting device according to an example embodiment.

Furthermore, FIG. 13 is a perspective view of a form of exemplary phase shift patterns 15 of a phase shifting device 20c according to another example embodiment. Referring to FIG. 13, each of the phase shift patterns 15 may have a square or rectangular shape. Then, the plurality of phase shift patterns 15 may be two-dimensionally arranged. Either or both of the width W of the plurality of phase shift patterns 15 or the interval S between the plurality of phase shift patterns 15 may vary locally depending on a position on the phase shifting device 20c. The phase shifting device 20c may be manufactured by patterning the multilayer thin-film structures 10 and 10a via a general semiconductor process.

Figure 14:
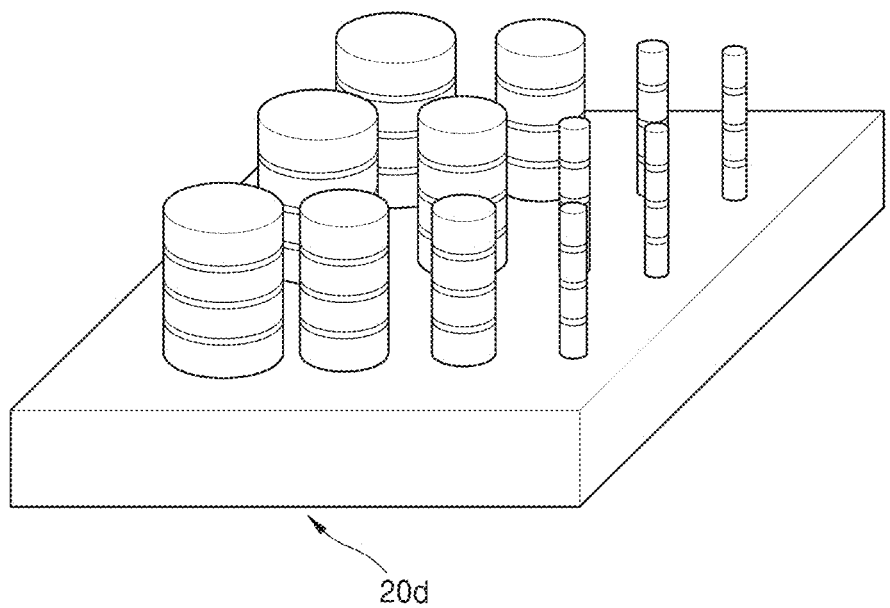
FIG. 14 is a perspective view of a form of exemplary phase shift patterns of a phase shifting device according to an example embodiment.

Furthermore, FIG. 14 is a perspective view of a form of exemplary phase shift patterns 15 of a phase shifting device 20d according to another example embodiment. Referring to FIG. 14, each of the phase shift patterns 15 may have a circular or oval shape, and the plurality of phase shift patterns 15 may be two-dimensionally arranged.

In addition, each of the phase shift patterns 15 may have various shapes. For example, each of the phase shift patterns 15 may have another polygonal shape, such as a hexagon. In addition, each of the phase shift patterns 15 may be a hole having a circular, oval, or polygonal shape.

Figure 15:
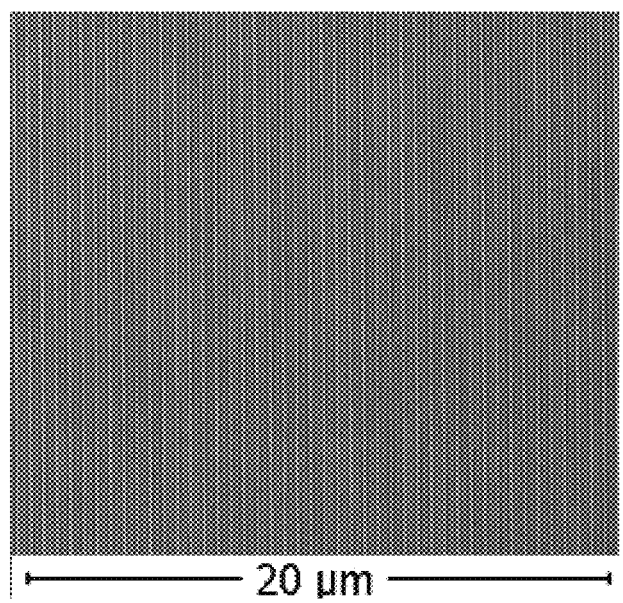
FIG. 15 is a photograph of a surface of a phase shifting device actually manufactured so as to have a nano-lattice phase shift pattern.

FIG. 15 is a photograph of a surface of a phase shifting device actually manufactured so as to have a nano-lattice phase shift pattern 15. The phase shift pattern 15 is formed by forming the multilayer thin-film structure 10 to a height of 400 nm using $TiO_2$ and $SiO_2$ and then patterning the multilayer thin-film structure 10 through exposure and etching processes.

Figure 16:
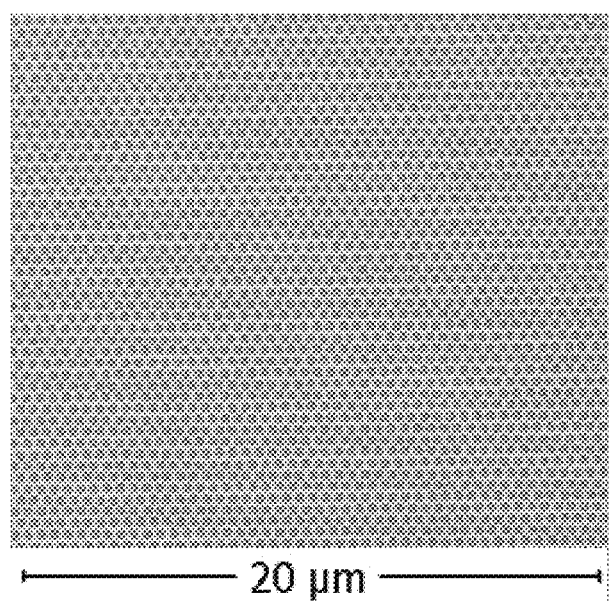
FIG. 16 is a photograph of a surface of a phase shifting device actually manufactured so as to have a nano-column phase shift pattern.

FIG. 16 is a photograph of a surface of a phase shifting device actually manufactured so as to have nano-column phase shift patterns 15. Each phase shift pattern 15 has a cylindrical shape. The phase shift pattern 15 is formed by forming the multilayer thin-film structure 10 to a height of 200 nm using $TiO_2$ and $SiO_2$ and then patterning the multilayer thin-film structure 10 through exposure and etching processes.

Figure 17:
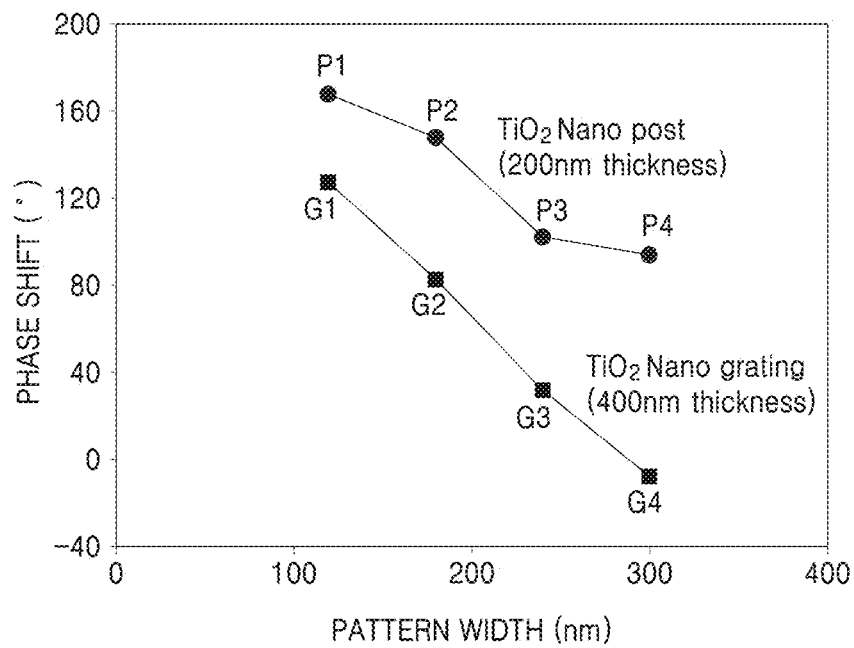
FIG. 17 is a graph showing a phase shift according to a change in widths of phase shift patterns in the phase shifting devices shown in FIGS. 15 and 16.

FIG. 17 is a graph showing a phase shift according to a change in widths or diameters of the phase shift patterns 15 in the phase shifting devices shown in FIGS. 15 and 16. In FIG. 17, G1, G2, G3, and G4 denote phase shifting devices having nano-lattice phase shift patterns 15 having different widths, and P1, P2, P3, and P4 denote phase shifting devices having nano-column phase shift patterns 15 having different diameters.

Referring to FIG. 17, phase delays for each of widths of the phase shift patterns 15 of 120 nm, 180 nm, 240 nm, and 300 nm in the phase shifting devices having the nano-lattice phase shift patterns 15 are 126°, 81°, 31°, and −8°, respectively. Therefore, as the widths of the phase shift patterns 15 increase, the phase delays decrease. A difference between the maximum phase delay and the minimum phase delay in the phase shifting devices with the illustrated nano-lattice phase shift patterns 15 is 134°.

Furthermore, for the phase shifting devices having the nano-column phase shift patterns 15, phase delays for each of diameters of the phase shift patterns 15 of 120 nm, 180 nm, 240 nm, and 300 nm in the phase shifting devices are 167°, 147°, 101°, and 93°, respectively. Therefore, as the diameters of the phase shift patterns 15 increase, the phase delays decrease. A difference between the maximum phase delay and the minimum phase delay in the phase shifting devices with the illustrated nano-column phase shift patterns 15 is 74°.

With such phase shifting devices, it is possible to condense incident light, scatter or reflect incident light in a specific direction, change a traveling direction of incident light, or transmit or reflect only light of a specific wavelength among incident light. In particular, it is possible to manufacture an optical device that exceeds a physical limitation of a diffraction phenomenon in a visible light band or a near-infrared wavelength band by implementing a line width of ¼ or less of the wavelength of the light by using a material having a high refractive index and a low extinction coefficient in the visible light band or the near-infrared wavelength band. Operating characteristics of the optical device may be determined according to phase shift distribution by arrangement of the phase shift patterns 15.

Figure 18:
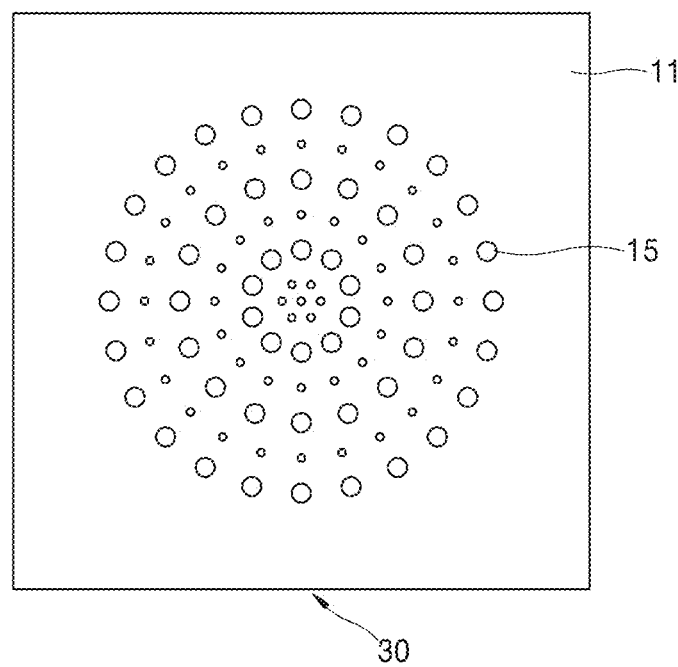
FIG. 18 is a view of the arrangement of nano-column phase shift patterns of a flat lens according to an example embodiment.

For example, FIG. 18 is a view of the arrangement of the nano-column phase shift patterns 15 of a flat lens 30 according to an example embodiment. Referring to FIG. 18, a plurality of phase shift patterns 15 having a cylindrical shape are arranged on the substrate 11 in the form of concentric circles. Diameters of the phase shift patterns 15 vary depending on position on the flat lens 30 and the phase shift patterns 15 arranged at an identical radial position from the center of the flat lens 30 may have an identical diameter. In other words, each concentric circle of phase shift patterns 15 have may a uniform diameter.

Figure 19:
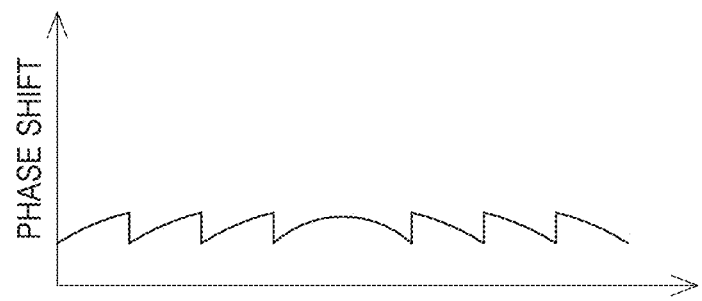
FIG. 19 is a graph of an example of a phase shift according to the position of the flat lens shown in FIG. 18.

FIG. 19 is a graph of an example of a resultant phase shift according to a position of the flat lens 30 shown in FIG. 18. In FIG. 19, the horizontal axis denotes a position in a cross-section across the center of the flat lens 30, and the vertical axis denotes phase delay. Diameters of the phase shift patterns 15 may vary in a radial direction from the center of the flat lens 30 so as to have the phase delay shown in FIG. 19.

Figure 20:
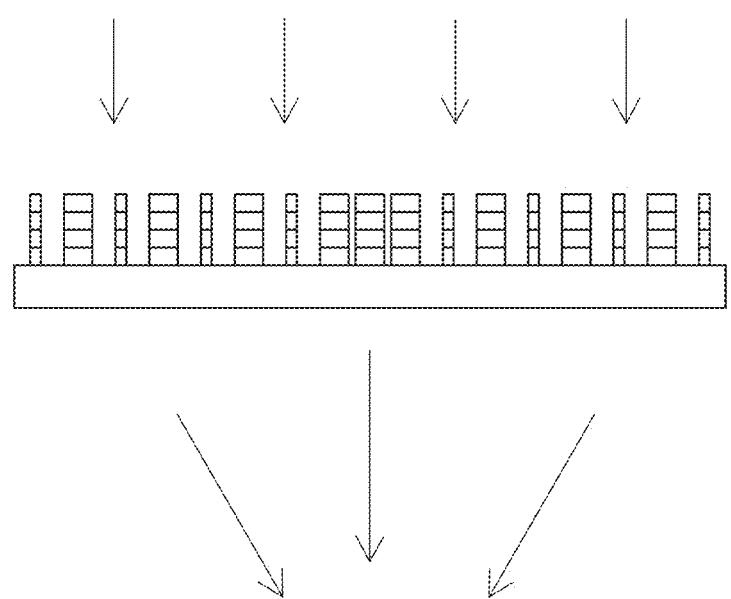
FIG. 20 is a cross-sectional view of an example of an operation of the flat lens shown in FIG. 18.

FIG. 20 is a cross-sectional view of an example of an operation of the flat lens 30 shown in FIG. 18. As shown in FIG. 20, the flat lens 30 having the phase delay distribution as shown in FIG. 19 may serve as a lens for condensing incident light. The flat lens 30 may be manufactured to a very small thickness of 1 μm or less, and thus may be employed in a small optical device or a small electronic device.

Figure 21:
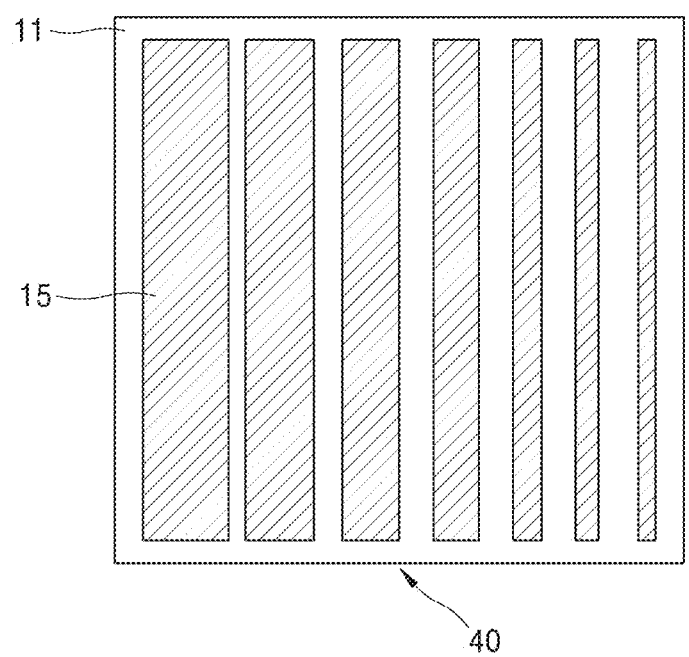
FIG. 21 is a view of the arrangement of nano-column phase shift patterns of a flat beam deflector according to an example embodiment.

FIG. 21 schematically shows the arrangement of the nano-column phase shift patterns 15 of a flat beam deflector 40 according to an example embodiment. Referring to FIG. 21, the plurality of phase shift patterns 15 having a straight bar shape are arranged on the substrate 11. Widths of the phase shift patterns 15 decrease and intervals between the phase shift patterns 15 increase toward the right side.

Figure 22:
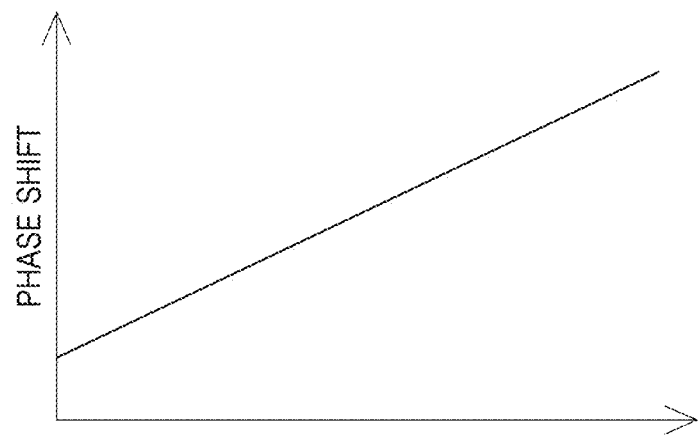
FIG. 22 is a graph of an example of a phase shift according to a position of the flat beam deflector shown in FIG. 21.

FIG. 22 is a graph of an example of a resultant phase shift according to a position of the flat beam deflector 40 shown in FIG. 21. Referring to FIG. 22, phase delays increase toward the right side of the flat beam deflector 40.

Figure 23:
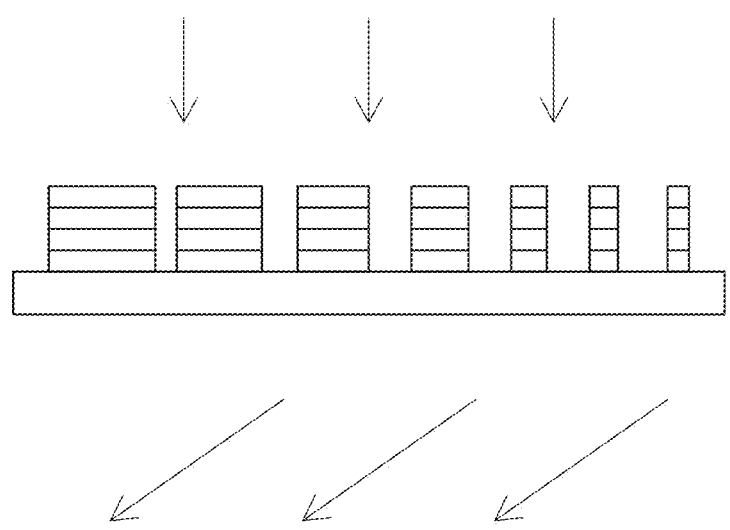
FIG. 23 is a cross-sectional view of an example of an operation of the flat beam deflector shown in FIG. 21.

FIG. 23 is a cross-sectional view of an example of an operation of the flat beam deflector 40 shown in FIG. 21. As shown in FIG. 23, the flat beam deflector 40 having the phase delay distribution as shown in FIG. 22 may change the traveling direction of incident light to a specific direction.

Various applications are possible in addition to the flat lens 30 and the flat beam deflector 40 shown in FIGS. 18 to 23. For example, a phase shifting device may be applied to a planar color filter, a planar spectroscope, or the like, which operates in a visible light band or a near-infrared band. In addition, the phase shifting device may be formed in an on-chip form on a semiconductor circuit structure such as an image sensor, a display device, a spatial light modulator, and the like.

Although the multilayer thin-film structure and the phase shifting device using the same have been described above with reference to the embodiments shown in the drawings, they are only examples. It should be understood that example embodiments described herein should be considered in a descriptive sense only and not for purposes of limitation. The scope of rights is indicated in the claims rather than the above description, and all differences within the scope of equivalents should be construed as being included in the scope of rights.

What is claimed is:

1. A multilayer thin-film structure comprising:
   at least one crystallization preventing layer; and
   at least one dielectric layer,
   wherein the at least one crystallization preventing layer comprises an amorphous material,
   wherein a thickness of the at least one crystallization preventing layer is less than a thickness of the at least one dielectric layer,
   wherein the at least one crystallization preventing layer and the at least one dielectric layer are alternately stacked,
   wherein a root mean square value of surface roughness of an uppermost surface of the multilayer thin-film structure is less than or equal to 2.5 nm, and
   wherein a sum of thicknesses of all of the at least one crystallization preventing layer is less than or equal to 5% of a total thickness of all of the at least one crystallization preventing layer and all of the at least one dielectric layer.

2. The multilayer thin-film structure of claim 1, further comprising:
   an amorphous substrate,
   wherein a lowermost dielectric layer from among the at least one dielectric layer is disposed on the amorphous substrate.

3. The multilayer thin-film structure of claim 1, further comprising:
   a crystalline substrate,
   wherein the at least one crystallization preventing layer and the at least one dielectric layer are alternately stacked on the crystalline substrate.

4. The multilayer thin-film structure of claim 1, wherein a refractive index of the at least one dielectric layer in a visible light band is greater than or equal to 2.4 and an extinction coefficient of the at least one dielectric layer in the visible light band is less than or equal to $1\times10^{-5}$.

5. The multilayer thin-film structure of claim 4, wherein an extinction coefficient of the at least one crystallization preventing layer in the visible light band is less than or equal to $1\times10^{-5}$.

6. The multilayer thin-film structure of claim 1, wherein the at least one dielectric layer comprises a crystalline material having a grain size that is less than or equal to 100 nm or an amorphous material.

7. The multilayer thin-film structure of claim 1, wherein the thickness of the at least one dielectric layer is within a range of 50 nm to 500 nm, and the thickness of the at least one crystallization preventing layer is less than or equal to 10 nm.

8. A phase shifting device comprising:
   a plurality of phase shift patterns, each of the plurality of phase shift patterns having at least one dimension smaller than a wavelength of visible light,
   wherein each of the plurality of phase shift patterns comprises at least one crystallization preventing layer and at least one dielectric layer that are alternately stacked,
   wherein the at least one crystallization preventing layer comprises an amorphous material,
   wherein a thickness of the at least one crystallization preventing layer is less than a thickness of the at least one dielectric layer,
   wherein a root mean square value of surface roughness of an uppermost surface of each of the plurality of phase shift patterns is less than or equal to 2.5 nm, and
   wherein a sum of thicknesses of all of the at least one crystallization preventing layer is less than or equal to 5% of a total thickness of all of the at least one crystallization preventing layer and all of the at least one dielectric layer in each of the plurality of phase shift patterns.

9. The phase shifting device of claim 8, further comprising:
   an amorphous substrate,
   wherein each of the plurality of phase shift patterns comprises a lowermost dielectric layer from among the at least one dielectric layer, the lowermost dielectric layer being stacked on the amorphous substrate.

10. The phase shifting device of claim 8, further comprising:
    a crystalline substrate, and
    each of the plurality of phase shift patterns comprises the at least one crystallization preventing layer and the at least one dielectric layer that are alternately stacked on the crystalline substrate.

11. The phase shifting device of claim 10, wherein a refractive index of the at least one dielectric layer in a visible light band is greater than or equal to 2.4 and an extinction coefficient of the at least one dielectric layer in the visible light band is less than or equal to $1\times10^{-5}$.

12. The phase shifting device of claim 11, wherein an extinction coefficient of the at least one crystallization preventing layer in the visible light band is less than or equal to $1\times10^{-5}$.

13. The phase shifting device of claim 8, wherein the at least one dielectric layer comprises a crystalline material having a grain size that is less than or equal to 100 nm or an amorphous material.

14. The phase shifting device of claim 8, wherein the thickness of the at least one dielectric layer is within a range of 50 nm to 500 nm, and the thickness of the at least one crystallization preventing layer is less than or equal 10 nm.

15. The phase shifting device of claim 8, wherein each of the plurality of phase shift patterns comprises a bar or a slit extending in a first direction, and the plurality of phase shift patterns are arranged in a second direction perpendicular to the first direction.

16. A thin-film material comprising:
    alternately stacked dielectric amorphous layers and crystallization preventing amorphous layers,
    wherein a thickness of each of the dielectric amorphous layers is less than a thickness at which the dielectric amorphous layers crystallize,
    wherein an uppermost layer of the thin-film material is a dielectric amorphous layer,
    wherein a root mean square value of a surface roughness of the uppermost layer is less than or equal to 2.5 nm, and
    wherein a sum of thicknesses of all of the crystallization preventing amorphous layers is less than or equal to 5% of a total thickness of all of the crystallization preventing amorphous layers and all of the dielectric amorphous layers.

17. The thin-film material of claim 16, wherein a thickness of each of the crystallization preventing amorphous layers is less than the thickness of each of the dielectric amorphous layers.

18. The thin-film material of claim 17, wherein the thickness of each of the crystallization preventing amorphous layers is less than or equal to 10 nm, and
wherein the thickness of each of the dielectric amorphous layers is within a range of 50 nm to 500 nm.

19. The thin-film material of claim 16, wherein a refractive index in a visible light band of the dielectric amorphous layers is greater than or equal to 2.4 and an extinction coefficient in the visible light band of the dielectric amorphous layers is less than or equal to $1\times10^{-5}$.

20. The thin-film material of claim 19, wherein an extinction coefficient in the visible light band of the crystallization preventing amorphous layers is less than or equal to $1\times10^{-5}$.

21. The thin-film material of claim 16, further comprising a plurality of structures formed on a substrate, each of the plurality of structures including the alternately stacked dielectric amorphous layers and the crystallization preventing amorphous layers.

22. The thin-film material of claim 21, wherein a width of each of the plurality of structures is less than a wavelength of visible light, and
wherein an interval between each of the plurality of structures is less than the wavelength of visible light.

* * * * *